(12) United States Patent
Yang et al.

(10) Patent No.: US 10,008,518 B2
(45) Date of Patent: Jun. 26, 2018

(54) THIN FILM TRANSISTOR ARRAY PANEL, LIQUID CRYSTAL DISPLAY AND MANUFACTURING METHOD THEREOF

(71) Applicant: Samsung Display Co., Ltd., Yongin-si (KR)

(72) Inventors: Chan Woo Yang, Siheung-si (KR); Hyun Eok Shin, Gwacheon-si (KR); Su Kyoung Yang, Yongin-si (KR); Dong Min Lee, Anyang-si (KR)

(73) Assignee: Samsung Display Co., Ltd, Yongin-si (KR)

( * ) Notice: Subject to any disclaimer, the term of this patent is extended or adjusted under 35 U.S.C. 154(b) by 267 days.

(21) Appl. No.: 14/926,416

(22) Filed: Oct. 29, 2015

(65) Prior Publication Data

US 2016/0293633 A1 Oct. 6, 2016

(30) Foreign Application Priority Data

Apr. 2, 2015 (KR) ........................ 10-2015-0046933

(51) Int. Cl.
*G02F 1/136* (2006.01)
*H01L 27/12* (2006.01)
*H01L 29/786* (2006.01)

(52) U.S. Cl.
CPC ........ *H01L 27/124* (2013.01); *H01L 27/1225* (2013.01); *H01L 27/1262* (2013.01); *H01L 29/7869* (2013.01); *H01L 29/78696* (2013.01)

(58) Field of Classification Search
CPC ............. G02F 1/1368; G02F 1/136227; H01L 27/124; H01L 27/1225; H01L 27/1262; H01L 29/7869; H01L 29/78696

USPC .......................................................... 349/43
See application file for complete search history.

(56) References Cited

U.S. PATENT DOCUMENTS

| 8,158,975 | B2 | 4/2012 | Akimoto |
| 9,099,438 | B2 | 8/2015 | Park et al. |
| 2009/0153056 | A1* | 6/2009 | Chen ...................... H01L 29/458 315/51 |
| 2013/0299817 | A1* | 11/2013 | Park ........................ H01L 29/45 257/43 |

FOREIGN PATENT DOCUMENTS

| KR | 1020100040677 | 4/2010 |
| KR | 1020130126240 | 11/2013 |

* cited by examiner

*Primary Examiner* — Nathanael R Briggs
*Assistant Examiner* — William Peterson
(74) *Attorney, Agent, or Firm* — H.C. Park & Associates, PLC (57) ABSTRACT

A thin-film transistor array panel includes a gate line disposed on a first substrate, the gate line including a gate electrode, a semiconductor layer disposed on the first substrate, the semiconductor layer including an oxide semiconductor, a data wire layer disposed on the first substrate, the data wire layer including a data line crossing the gate line, a source electrode connected to the data line, and a drain electrode facing the source electrode, a capping layer disposed on the data wire layer, a tilt layer disposed on the capping layer, and a passivation layer disposed on the tilt layer, in which the tilt layer includes a silsesquioxane-based copolymer.

17 Claims, 12 Drawing Sheets

THIN FILM TRANSISTOR ARRAY PANEL, LIQUID CRYSTAL DISPLAY AND MANUFACTURING METHOD THEREOF

CROSS-REFERENCE TO RELATED APPLICATION

This application claims priority from and the benefit of Korean Patent Application No. 10-2015-0046933, filed on Apr. 2, 2015, which is hereby incorporated by reference for all purposes as if fully set forth herein.

BACKGROUND

Field

Exemplary embodiments relate to a thin-film transistor array panel, a liquid crystal display, and a manufacturing method thereof.

Discussion of the Background

In general, flat panel displays, such as a liquid crystal display or an organic light emitting device, may include multiple pairs of electric field generating electrodes and electro-optical active layers disposed therebetween. A liquid crystal display may include a liquid crystal layer as an electro-optical active layer and the organic light emitting device may include an organic light emission layer as an electro-optical active layer.

One of the electric field generating electrodes that forms the pair may be connected to a switching element, which may be applied with an electric signal, and the electro-optical active layer may convert the electric signal into an optical signal to display an image.

A flat panel display may include a thin-film transistor (TFT), which is a three-terminal element used as the switching element, a signal line, such as a gate line transferring a scanning signal for controlling the thin-film transistor, and a data line transferring a signal to be applied to a pixel electrode.

As an area of a display device becomes larger, oxide semiconductor technology and a method of reducing resistance in signal lines has been researched in order to implement high-speed driving. Particularly, to reduce the resistance of the signal line, a data wiring layer may be formed of copper, a copper alloy, molybdenum, a molybdenum alloy, or the like. However, a thin-film transistor characteristic may deteriorate due to a reaction between the data wiring layer formed of metal and other layers in a manufacturing process, and the like. For example, when forming a passivation layer including a silicon oxide after forming the data wire layer, a charge mobility may be decreased by oxidation of a material of the data wire layer.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a thin-film transistor array panel for improving the characteristics of a thin-film transistor and minimizing product defects in a manufacturing process, a liquid crystal display, and a manufacturing method thereof.

Additional aspects will be set forth in the detailed description which follows, and, in part, will be apparent from the disclosure, or may be learned by practice of the inventive concept.

An exemplary embodiment discloses a thin-film transistor array panel including a gate line disposed on a first substrate, the gate line including a gate electrode, a semiconductor layer disposed on the first substrate, the semiconductor layer including an oxide semiconductor, a data wire layer disposed on the first substrate, the data wire layer including a data line crossing the gate line, a source electrode connected to the data line, and a drain electrode facing the source electrode, a capping layer disposed on the data wire layer, a tilt layer disposed on the capping layer, and a passivation layer disposed on the tilt layer, in which the tilt layer includes a silsesquioxane-based copolymer.

An exemplary embodiment also discloses a liquid crystal display including a gate line disposed on a first substrate, the gate line including a gate electrode, a semiconductor layer iii disposed on the first substrate, the semiconductor layer including an oxide semiconductor, a data line disposed on the first substrate and crossing the gate line, a data wire layer including a source electrode connected to the data line and a drain electrode facing the source electrode, a capping layer disposed on the data wire layer, a tilt layer disposed on the capping layer, a passivation layer disposed on the tilt layer, a second substrate facing the first substrate, a liquid crystal layer disposed between the first substrate and the second substrate, and a common electrode disposed on one of the first substrate and the second substrate, in which the tilt layer includes a silsesquioxane-based copolymer.

An exemplary embodiment further discloses a method for manufacturing a thin-film transistor array panel including forming a gate line including a gate electrode on a first substrate, forming a gate insulating layer covering the gate line, forming a semiconductor material layer on the first substrate, forming a data wire material layer on the semiconductor material layer, forming a capping material layer on the data wire material layer, forming a first photosensitive film pattern on the capping material layer, the first photosensitive film pattern including a first region and a second region having a greater thickness than the first region, etching the capping material layer, the data wire material layer, and the semiconductor material layer by using the first photosensitive film pattern as a mask, performing an etch back for the first photosensitive film pattern to form a second photosensitive film pattern, etching the capping material layer and the data wire material layer by using the second photosensitive film pattern as a mask to form a capping layer and a data wire layer, removing the second photosensitive film pattern, and forming a tilt layer on the capping layer by a solution process, in which wherein an edge of the capping layer includes a protrusion that protrudes outwardly from an edge of the data wire layer.

According to the thin-film transistor array panel and the manufacturing method thereof according to an exemplary embodiment, the characteristic of the thin-film transistor may be improved and defects may be prevented from being generated therein.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
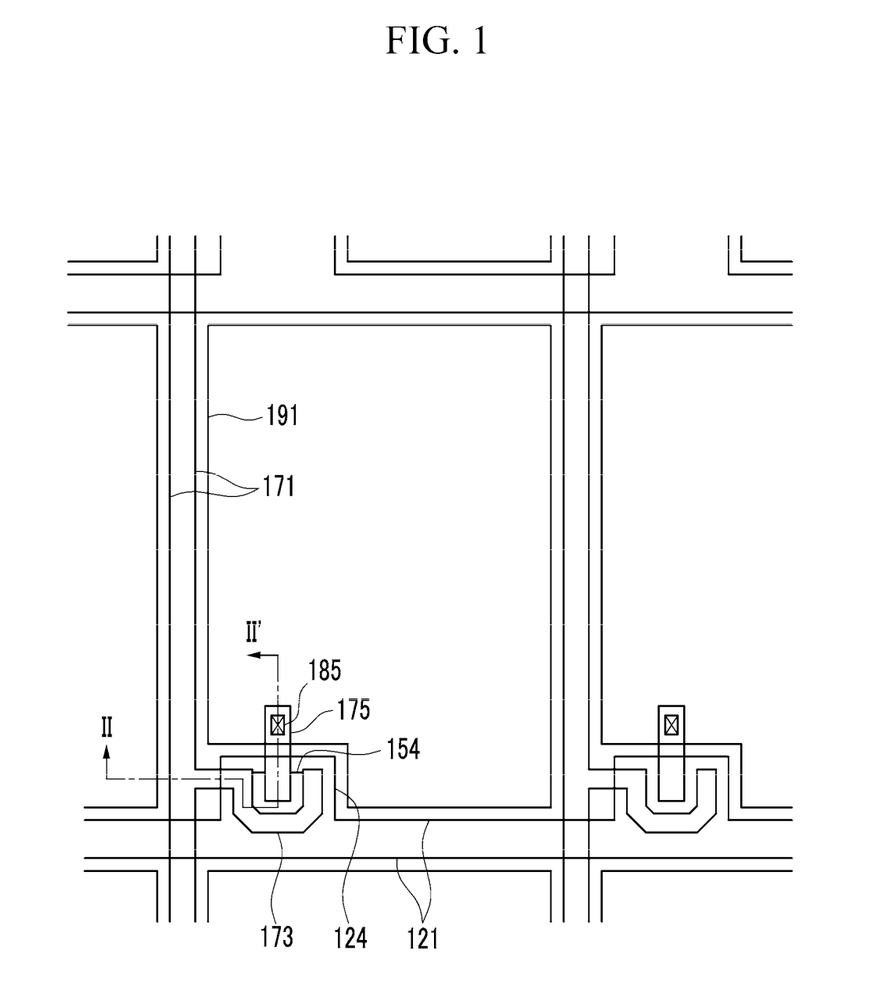
FIG. 1 is a top plan view of a thin-film transistor array panel according to an exemplary embodiment.
Figure 2:
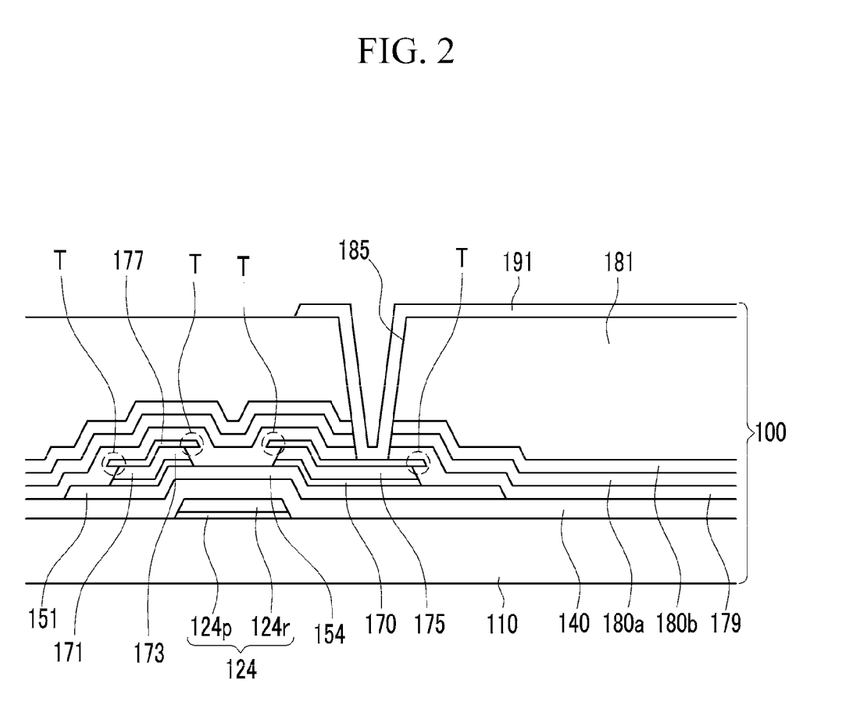
FIG. 2 is a cross-sectional view taken along line II-II' of FIG. 1.

Referring to FIG. 1 and FIG. 2, a thin-film transistor array panel according to an exemplary embodiment will be described. FIG. 1 is a top plan view of a thin-film transistor array panel according to the present exemplary embodiment. FIG. 2 is a cross-sectional view taken along line II-II' of FIG. 1.

Referring to FIG. 1 and FIG. 2, gate lines 121 are disposed on a first substrate 110 formed of transparent glass or plastic. The gate lines 121 may transmit gate signals, and mainly extend in a horizontal direction. Each gate line 121 includes gate electrodes 124 protruding therefrom.

The gate line 121 and the gate may have a double-layer structure including a lower layer 124$p$ and an upper layer 124$r$. The lower layer 124$p$ may be formed of any one of titanium (Ti), tantalum (Ta), molybdenum (Mo), and alloys thereof, and the upper layer 124$r$ may be formed of copper (Cu) or a copper alloy. In the present exemplary embodiment, the gate line 121 and the gate electrode 124 have the double-layer structure, but the gate line 121 and the gate electrode 124 may have a single-layer structure or a triple or more layer structure.

A gate insulating layer 140 formed of an insulating material, such as silicon oxide or silicon nitride, is disposed on the gate line 121 and the gate electrode 124. In the present exemplary embodiment, the gate insulating layer 140 has a single-layer form, but the gate insulating layer 140 may have a structure, of which a lower layer thereof is formed of silicon nitride ($SiN_x$) or silicon oxynitride (SiON) and an upper layer formed of silicon oxide ($SiO_2$).

Semiconductor layers 151 formed of an oxide semiconductor is disposed on the gate insulating layer 140. The semiconductor layer 151 mainly extends in a vertical direction, and includes projections extending toward the gate electrode 124. The semiconductor layer 151 includes at least one of zinc (Zn), indium (In), tin (Sn), gallium (Ga), and hafnium (Hf). In the present exemplary embodiment, the semiconductor layer 151 may be indium-gallium-zinc oxide (IGZO).

A barrier layer 170 is disposed on the semiconductor layer 151. The barrier layer 170 includes metal oxide, and may be formed of indium-zinc oxide (IZO), gallium-zinc oxide (GZO), aluminum-zinc oxide (AZO), and the like. The barrier layer 170 may be omitted.

A data line 171 extending in a vertical direction, a source electrode 173 connected to the data line 171, and a drain electrode 175 facing the source electrode 173 are disposed on the barrier layer 170.

A data wire layer including the data line 171, the source electrode 173, and the drain electrode 175 may be made of an aluminum-based metal, such as aluminum (Al) or an aluminum alloy, a silver-based metal such as silver (Ag) or a silver alloy, a copper-based metal such as copper (Cu) or a copper alloy like copper manganese, a molybdenum-based metal such as molybdenum (Mo) or a molybdenum alloy, chromium (Cr), tantalum (Ta), or titanium (Ti). Further, a data wire layer including the source electrode 173 and the drain electrode 175 may be made of a transparent conductive material, such as indium-tin oxide (ITO), indium-zinc oxide (IZO), and aluminum-zinc oxide (AZO). In the present exemplary embodiment, the data wire layer may be made of a copper-based metal such as copper (Cu) or a copper-manganese alloy (Cu/Mn).

The data line 171, the source electrode 173, and the drain electrode 175 may have a multilayer structure including two or more conductive layers (not illustrated). The source electrode 173 may be formed to overlap the gate electrode 124 and generally have a "U" shape. The drain electrode 175 may be formed to face the source electrode 173 with the gate electrode 124 disposed therebetween and extend upwardly from the center of the "U" shape of the source electrode 173. The structures of the source electrode 173 and the drain electrode 175 may be variously modified.

A capping layer 177 is disposed on the data line 171, the source electrode 173, and the drain electrode 175. In the present exemplary embodiment, the capping layer 177 includes metal oxide, and may be formed of indium-zinc oxide (IZO), gallium-zinc oxide (GZO), aluminum-zinc oxide (AZO), and the like. The capping layer 177 may be formed of a copper-manganese metal oxide, and thus may have a lower slope (threshold slope) after a threshold voltage in a voltage-current graph exhibiting a thin-film transistor characteristic. Accordingly, the thin-film transistor characteristic may be improved.

In the present exemplary embodiment, an edge of the capping layer 177 includes a protrusion T that protrudes outwardly, as compared to an edge of the data wire layer including the data line 171, the source electrode 173, and the drain electrode 175. Referring to FIG. 2, the edge of the capping layer 177 protrudes from the edge end of the data line 171, the source electrode 173, and the drain electrode 175 in a horizontal direction. The protrusion T may prevent a copper oxide ($Cu_xO$), which may be generated in the side wall of the source electrode 173 and the drain electrode 175, from being generated in the upper end of the source electrode 173 and the drain electrode 175.

The length of the protrusion T of the capping layer 177 may be about 0.01% to 5.00% of a width length of the source electrode 173 and the drain electrode 175.

According to an exemplary embodiment, the capping layer 177 may not include the protrusion T, and the horizontal edge end of the data wire layers 171, 173, and 175 may coincide with the horizontal end of the capping layer 177.

One gate electrode 124, one source electrode 173, and one drain electrode 175 form one thin-film transistor (TFT) together with the semiconductor layer 154. A channel region of the thin-film transistor is formed between the source electrode 173 and the drain electrode 175.

The projections of the semiconductor layer 151 includes an exposed portion between the source electrode 173 and the drain electrode 175, which may not be covered by the source electrode and the drain electrode 175, and the channel region may correspond to the exposed portion of the semiconductor layer 151.

A tilt layer 179 is disposed to cover the capping layer 177, the source electrode 173, the drain electrode 175, and the exposed portion of the semiconductor layer 151 on the gate insulating layer 140. The tilt layer 179 includes a silsesquioxane-based copolymer. In this case, to prevent the tilt layer 179 from being lifted, a content of the silsesquioxane-based copolymer in the tilt layer 179 may be at least 15 wt %, thereby improving the strength of the tilt layer 179.

The tilt layer 179 covers the protrusion T of the capping layer 177 and may fill an empty space under the protrusion T. The tilt layer 179 may have a thickness in the range of 100 Å-3000 Å with respect to the upper portion of the source electrode 173, the drain electrode 175, and the upper portion of the semiconductor layer 151, except for a portion corresponding to the side wall of the source electrode 173 and the drain electrode 175.

A passivation layer 180a and 180b is disposed on the tilt layer 179. The passivation layer 180a and 180b is made of an inorganic insulator, such as silicon nitride ($SiN_x$) or silicon oxide ($SiO_x$), an organic insulator, a low dielectric insulator, and the like. In the present exemplary embodiment, the passivation layer 180a and 180b may be a dual layer, of which the first passivation layer 180a may be made of silicon oxide ($SiO_x$), and the second passivation layer 180b may be made of silicon nitride ($SiN_x$).

The tilt layer 179 may prevent the generation of cracks in the passivation layer 180a and 180b, due to the copper oxide ($Cu_xO$) formed at the protrusion T of the capping layer 177 and the side wall of the source electrode 173 and the drain electrode 175.

A planarization insulating layer 181 is disposed on the passivation layers 180a and 180b. The planarization insulating layer 181 is formed of the organic insulator and may provide a flat surface. The organic insulator may have a photosensitivity, and a dielectric constant thereof may be less than about 4.0. The planarization insulating layer 181, the passivation layers 180a and 180b, and the tilt layer 179 have a contact hole 185 exposing a portion of the capping layer 177.

A pixel electrode 191 is disposed on the planarization insulating layer 181. The pixel electrode 191 is physically and electrically connected to the capping layer 177 and the drain electrode 175 through the contact hole 185, and receives a data voltage from the drain electrode 175. The pixel electrode 191 may be made of a transparent conductor, such as indium-tin oxide (ITO) or indium-zinc oxide (IZO).

Figure 3:
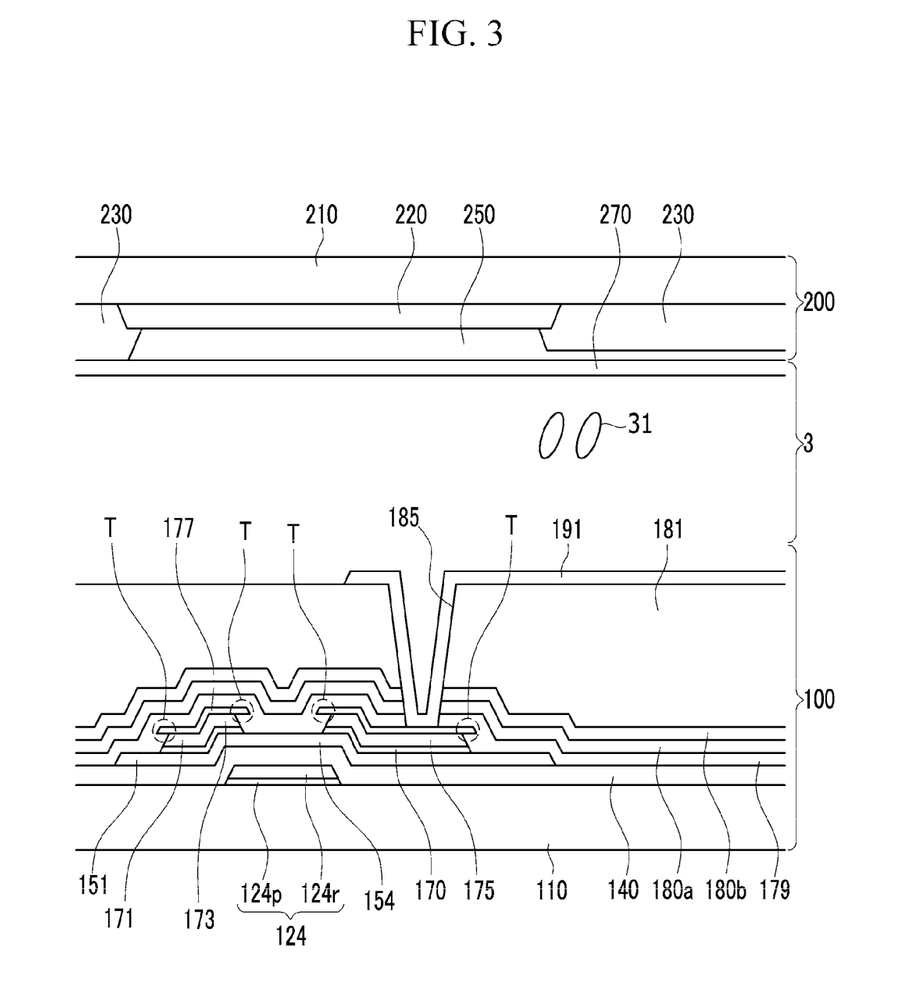
FIG. 3 is a cross-sectional view of a liquid crystal display applied with the thin-film transistor array panel of FIG. 2.

Next, a method of applying the thin-film transistor array panel of FIG. 2 in a liquid crystal display according to an exemplary embodiment will be described with reference to FIG. 3. FIG. 3 is a cross-sectional view of a liquid crystal display applied with the thin-film transistor array panel of FIG. 2.

Since the shape and the deposition structure of the thin-film transistor array panel 100 are described above with reference to FIG. 1 and FIG. 2, duplicated description thereof will be omitted, and an opposing display panel 200 will mainly be described.

Referring to FIG. 3, the opposing display panel 200 includes a second substrate 210 disposed to face the first substrate 110. The second substrate 210 may be an insulation substrate made of transparent glass or plastic. A light blocking member 220 is formed on the second substrate 210. The light blocking member 220 may be referred to as a black matrix, which may prevent light leakage.

Color filters 230 are disposed on the second substrate 210 and the light blocking member 220. Substantial portions of the color filters 230 are disposed within the area surrounded by the light blocking member 220, and may longitudinally extend along the columns of the pixel electrodes 191. Each of the color filters 230 may display one basic color, such as one of the three primary colors red, green, and blue. Alternatively, each of the color filters 230 may display one of cyan, magenta, yellow, or a white-based color.

The light blocking member 220 and the color filter 230 are disposed on an opposing display panel 200 as described above, however, at least one of the light blocking member 220 and the color filter 230 may be formed on the thin-film transistor array panel 100.

An overcoat 250 is disposed on the color filter 230 and the light blocking member 220. The overcoat 250 may be made of an insulation material, prevent the color filter 230 from being exposed, and provide a flat surface. The overcoat 250 may be omitted.

A common electrode 270 is disposed on the overcoat 250 and the color filter 230.

The pixel electrode 191 applied with the data voltage may generate an electric field together with the common electrode 270 applied with the common voltage, to determine a direction of liquid crystal molecules 31 of a liquid crystal layer 3 between the two electrodes 191 and 270. The pixel electrode 191 and the common electrode 270 may constitute a capacitor to maintain the applied voltage, even after the thin-film transistor is turned off.

The pixel electrode 191 overlaps with a storage electrode line (not illustrated) to constitute a storage capacitor, and as a result, the voltage storing capability of a liquid crystal capacitor may be reinforced.

Herein, although the thin-film transistor array panel 100 according to the present exemplary embodiment is applied to the liquid crystal display, the thin-film transistor array panel 100 may be widely applied to an organic light emitting device and other display devices that may perform a switching operation by using a thin-film transistor.

Next, a method of manufacturing the thin-film transistor array panel illustrated with reference to FIG. 1 and FIG. 2 will be described with reference to FIG. 4 to FIG. 11.

FIG. 4 to FIG. 11 are cross-sectional views of a manufacturing method of a thin-film transistor array panel according to an exemplary embodiment. FIG. 4 to FIG. 11 show the cross-sectional views taken along line II-II' of FIG. 1 according to a process sequence.

Figure 4:
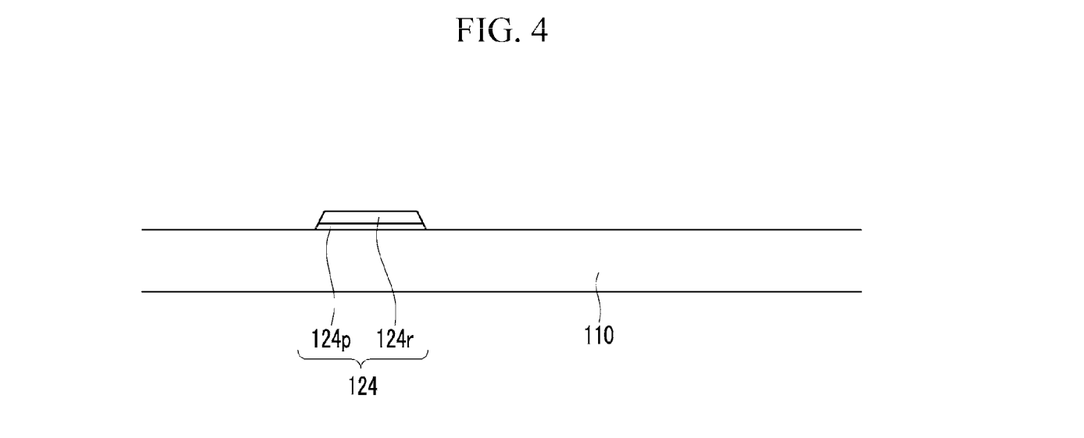
FIG. 4, FIG. 5, FIG. 6, FIG. 7, FIG. 8, FIG. 9, FIG. 10, and FIG. 11 are cross-sectional views of a manufacturing method of a thin-film transistor array panel according to an exemplary embodiment.

Referring to FIG. 4, a gate electrode 124 is disposed on a first substrate 110 made of transparent glass or plastics. The gate electrode 124 may have a double-layer structure formed of a lower layer 124p and an upper layer 124r. Alternatively the gate electrode 124 may have a single-layered structure or a triple or more layer structure.

Figure 5:
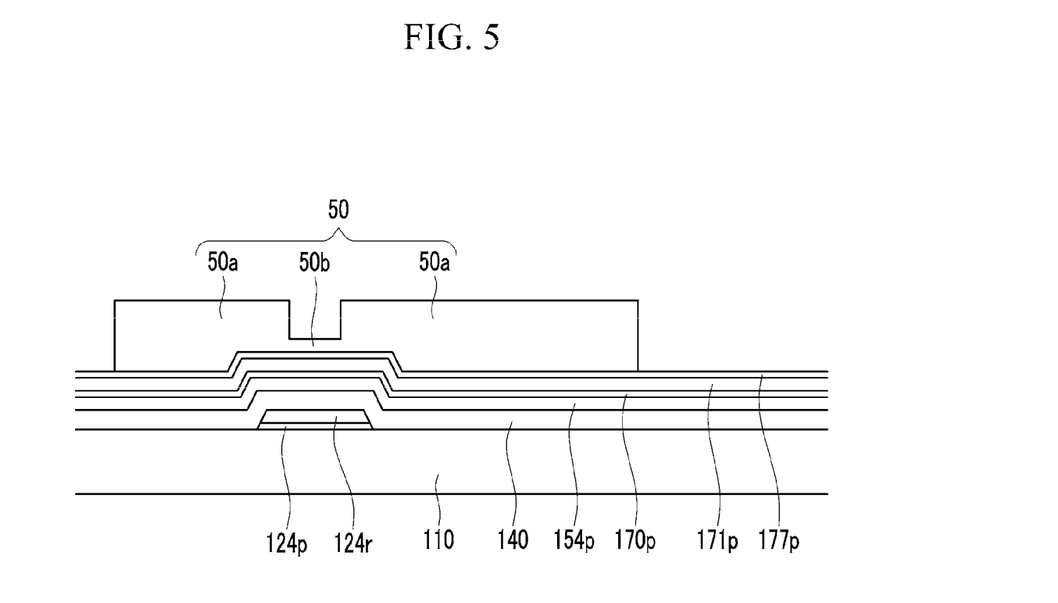

Referring to FIG. 5, a gate insulating layer 140 is disposed on the first substrate 110 to cover the gate electrode 124, and a semiconductor material layer 154p, a barrier material layer 170p, a data wire material layer 171p, and a capping material layer 177p are sequentially disposed on the gate insulating layer 140. A step of forming the barrier material layer 170p may be omitted.

The capping material layer 177p includes metal oxide, and may be formed of indium-zinc oxide (IZO), gallium-zinc oxide (GZO), aluminum-zinc oxide (AZO), and the like. The data wire material layer 171p may be made of an aluminum-based metal, such as aluminum (Al) or an aluminum alloy, a silver-based metal such as silver (Ag) or a silver alloy, a copper-based metal such as copper (Cu) or a copper alloy such as copper manganese, a molybdenum-based metal such as molybdenum (Mo) or a molybdenum alloy, chromium (Cr), tantalum (Ta), or titanium (Ti). In the present exemplary embodiment, the data wire material may be the copper-based metal, such as copper (Cu) or a copper-manganese alloy (Cu/Mn).

The barrier material layer 170p includes metal oxide, and may be formed of indium-zinc oxide (IZO), gallium-zinc oxide (GZO), aluminum-zinc oxide (AZO), and the like. The semiconductor material layer 154p may be formed of an oxide semiconductor including at least one of zinc (Zn), indium (In), tin (Sn), gallium (Ga), and hafnium (Hf). In the present exemplary embodiment, the semiconductor material layer 154p may be indium-gallium-zinc oxide (IGZO).

Next, a first photosensitive film pattern 50 is disposed on the capping material layer 177p. The first photosensitive film pattern 50 has a thick first region 50a and a relatively thin second region 50b. A difference in thickness of the first photosensitive film pattern 50 may be obtained by adjusting the amount of light radiated using a mask or by using a reflow method. When the amount of light is adjusted, a slit pattern, a lattice pattern, or a semi-transparent layer may be formed on the mask. The relatively thin second region 50b may correspond to a region on which the channel region of the thin-film transistor will be formed.

Figure 6:
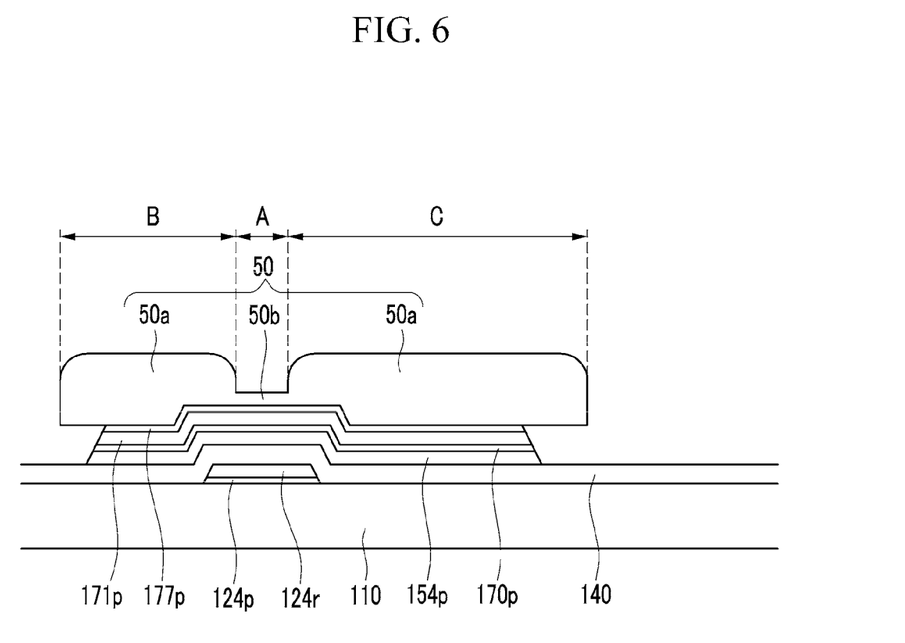

Referring to FIG. 6, the capping material layer 177p, the data wire material layer 171p, and the barrier material layer 170p are wet etched by using an etchant that may etch the capping material layer 177p, the data wire material layer 171p, and the barrier material layer 170p together, by using the first photosensitive film pattern 50 as a mask.

As illustrated in FIG. 6, when the capping material layer 177p, the data wire material layer 171p, and the barrier material layer 170p are etched, lateral surfaces of the capping material layer 177p, the data wire material layer 171p, and the barrier material layer 170p covered by the first photosensitive film pattern 50 are etched by the etchant. Accordingly, boundary lines of the capping material layer 177p, the data wire material layer 171p, and the barrier material layer 170p are positioned inside regions A, B, and C, where the first photosensitive film pattern 50 is formed.

Figure 7:
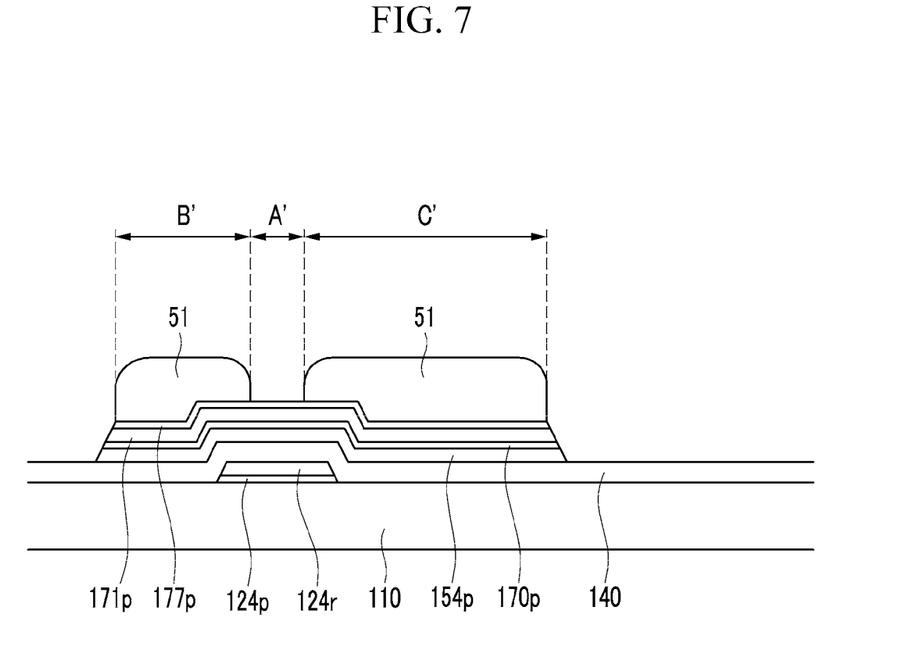

Referring to FIG. 7, the first photosensitive film pattern 50 is subjected to etch back to remove the relatively thin second region 50b. In this case, the first region 50a is etched together to reduce a width and a height thereof, thus forming a second photosensitive film pattern 51, as illustrated in FIG. 7. The second photosensitive film pattern 51 is formed in regions A', B', and C', which are narrower than the regions A, B, and C where the first photosensitive film pattern 50 is formed in FIG. 6. An upper surface of the capping material layer 177p is exposed through the second photosensitive film pattern 51, and the exposed upper surface of the capping material layer 177p corresponds to a channel region of a semiconductor layer to be subsequently formed.

Figure 8:
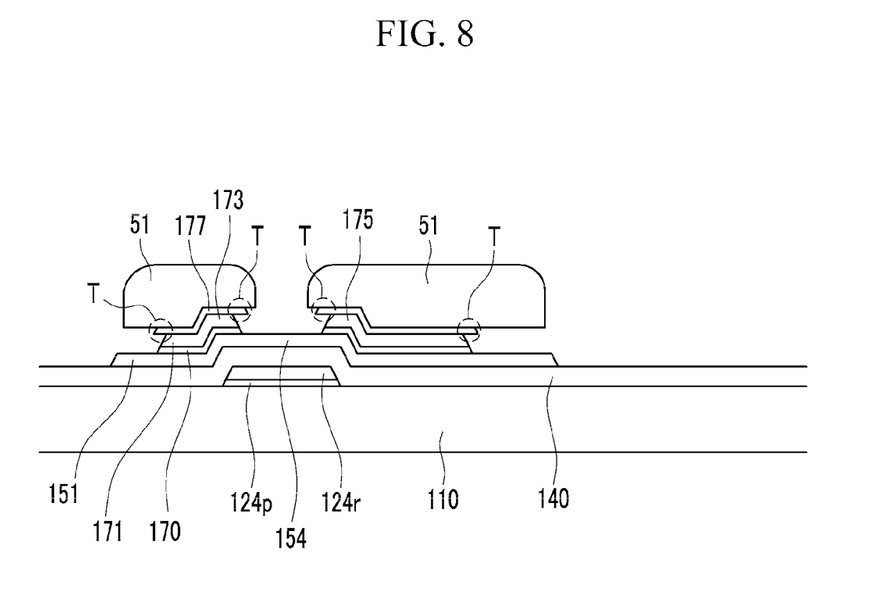

Referring to FIG. 7, the capping material layer 177p and the data wire material layer 171p are wet etched by using the second photosensitive film pattern 51 as a mask to form the capping layer 177, the source electrode 173, and the drain electrode 175. Herein, an etching speed of the capping material layer 177p may be slower than an etching speed of the data wire material layer 171p, and thus, the end of the horizontal edge of the capping layer 177 may have a protrusion T protruding from the end of the horizontal edge of each of the data line 171, the source electrode 173, and the drain electrode 175, as illustrated in FIG. 8. Particularly, since the etching speed of the capping material layer 177p formed of indium-zinc oxide (IZO) is slower than those of other materials (e.g., gallium-zinc oxide), the length of the projection T of the capping layer 177 may be increased. Alternatively, the edge of the capping layer 177 may be formed to match with the horizontal edge boundary of the data wire layers 171, 173, and 175, depending on the process margin.

Figure 9:
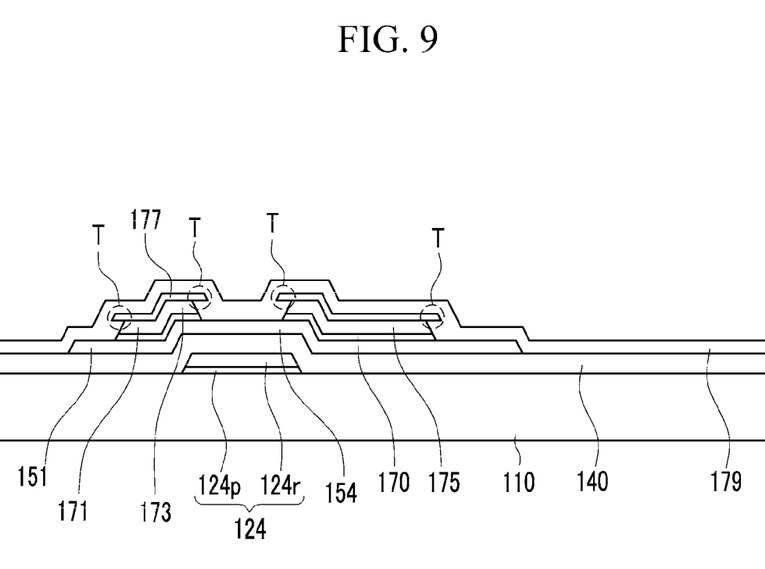

Referring to FIG. 9, after removing the second photosensitive film pattern 51, a tilt layer 179 is formed through a solution process to cover the capping layer 177, the source electrode 173, the drain electrode 175, the semiconductor layer 151, and the exposed portion of the gate insulating layer 140.

The solution process may be a process of forming a layer by removing flowability of a mixture provided on a substrate, by storing the mixture at room temperature or thermally treating the mixture above room temperature. In the present exemplary embodiment, a step of filling a propylene glycol monomethyl ether acetate (PGMEA) solvent including the silsesquioxane-based copolymer solid on the capping layer 177, the source electrode 173, the drain electrode 175, the semiconductor layer 151, and the gate insulating layer 140 may be performed. The filling may be performed by applying a generally known coating method, such as a spin coating method, a dip coating method, a spray coating method, and a bar coating method.

The tilt layer 179 is formed to have a smooth inclination shape to cover the protrusion T of the capping layer 177, and may fill the empty space under the protrusion T. The tilt layer 179 may be formed to have a thickness of about 100 Å to about 3000 Å with respect to the upper portion of the source electrode 173, the drain electrode 175, and the semiconductor layer 151, except for a portion corresponding to the side wall of the source electrode 173 and the drain electrode 175. The copper oxide ($Cu_xO$), which may be formed at the side wall of the source electrode 173 and the drain electrode 175, and the protrusion T protruded from the capping layer 177 may cause a crack in the passivation layers 180a and 180b. The tilt layer 179 according to the present exemplary embodiment is formed to cover the copper oxide ($Cu_xO$) and the protrusion T of the capping layer 177 in a smooth inclination shape, thereby preventing the crack from being generated in the passivation layer 180a and 180b. The content of the silsesquioxane-based copolymer solid may be more than 15 wt %.

Figure 10:
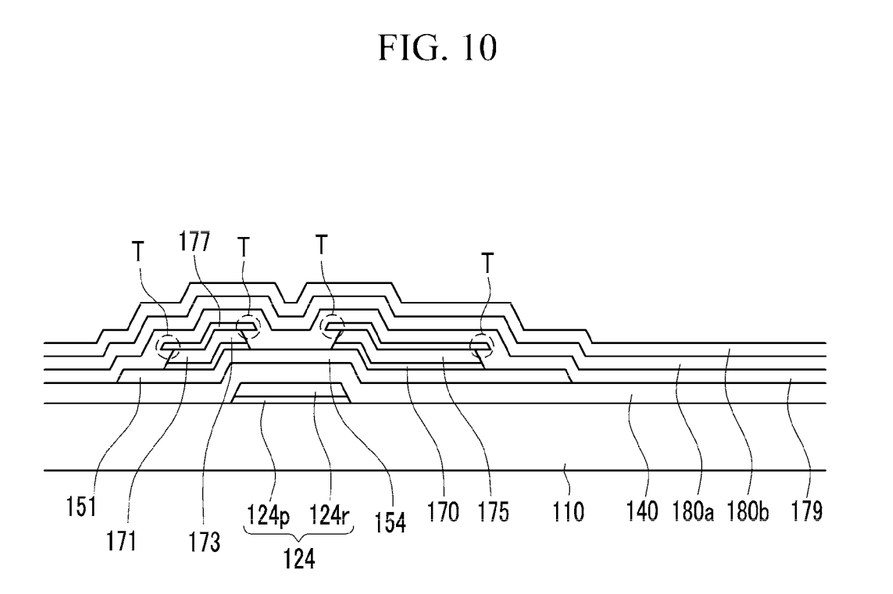

Referring to FIG. 10, passivation layers 180a and 180b are disposed on the tilt layer 179 through a chemical vapor deposition (CVD) process. The chemical vapor deposition process may be a technique for depositing a material on a substrate surface by reacting a mixture in a gas state to the heated substrate surface. The CVD process may include an atmospheric pressure CVD (APCVD), a low pressure CVD (LPCVD), and a plasma enhanced CVD (PECVD).

The passivation layers 180a and 180b may be formed as a dual layer or multiple layers, and may be made of an inorganic insulator, such as silicon nitride ($SiN_x$) or silicon oxide ($SiO_x$), the organic insulator, and the low dielectric insulator. In the present exemplary embodiment, the passivation layers 180a and 180b are a dual layer, of which the first passivation layer 180a may be formed of silicon oxide ($SiO_x$) and the second passivation layer 180b may be formed of silicon nitride ($SiN_x$).

Figure 11:
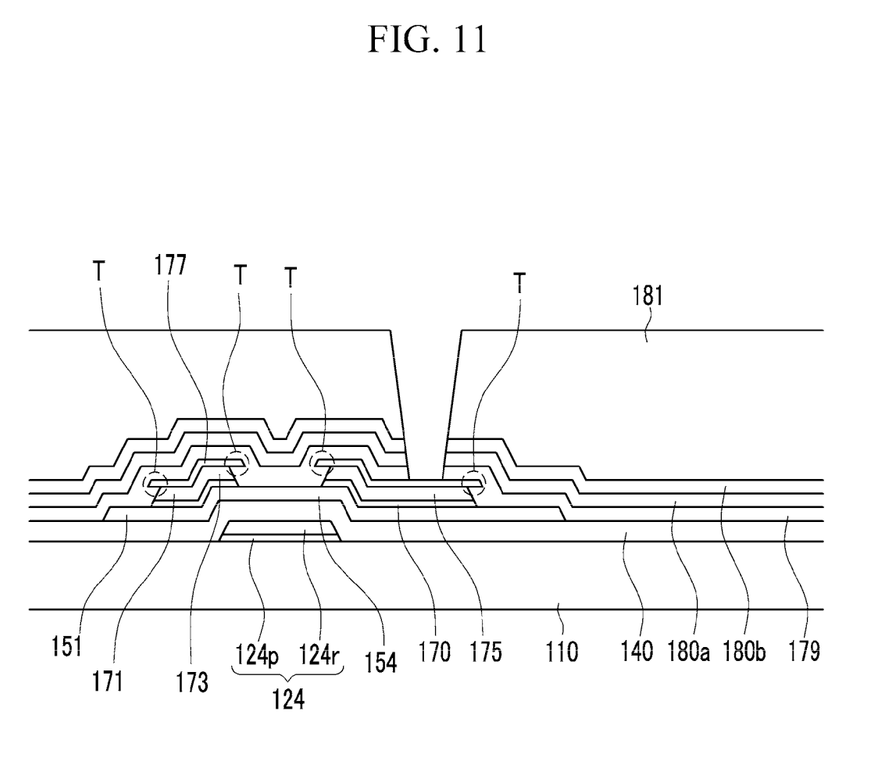

Referring to FIG. 11, a planarization insulating layer 181 is disposed on the passivation layers 180a and 180b. The planarization insulating layer 181 is made of the organic insulator and may provide a flat surface. The organic insulator may have photosensitivity, and the dielectric constant thereof may be less than about 4.0. The planarization insulating layer 181, the passivation layers 180a and 180b, and the tilt layer 179 have a contact hole 185 exposing one end of the capping layer 177.

Next, a pixel electrode 191, which may be physically and electrically connected to the capping layer 177 and the drain electrode 175 through the contact hole 185, is disposed on the planarization insulating layer 181 to form the thin-film transistor array panel.

Next, a thin-film transistor array panel according to an exemplary embodiment will be described with reference to FIG. 12. The shape and the deposition structure of the thin-film transistor array panel of FIG. 12 may be substantially similar to the thin-film transistor array panel 100 illustrated with reference to FIG. 1 and FIG. 2, and thus, duplicative description thereof will be omitted.

Figure 12:
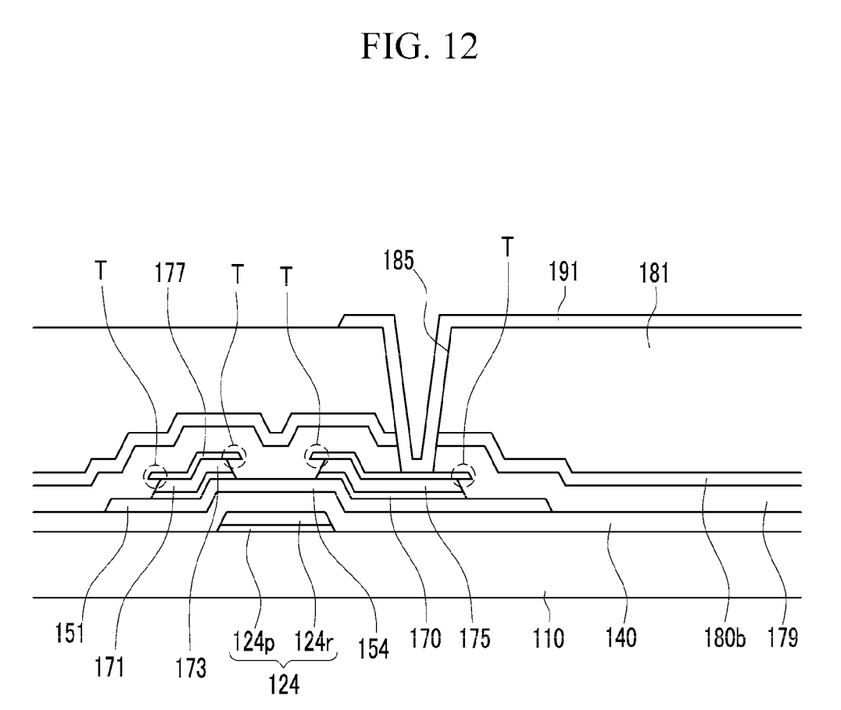
FIG. 12 is a cross-sectional view of a thin-film transistor array panel according to an exemplary embodiment.

FIG. 12 is a cross-sectional view of a thin-film transistor array panel according to an exemplary embodiment.

On the first substrate 110 of the thin-film transistor array panel 100, the gate line 121, the gate electrode 124, the gate insulating layer 140, the semiconductor layer 151, the barrier layer 170, the data wire layers 171, 173, and 175, and the capping layer 177 are sequentially deposited.

The tilt layer 179 is disposed to cover the exposed portion of the capping layer 177, the source electrode 173, the drain electrode 175, the semiconductor layer 151, and the gate insulating layer 140. The tilt layer 179 includes the silsesquioxane-based copolymer. In this case, to prevent the tilt layer 179 from being lifted, a content of the silsesquioxane-based copolymer in the tilt layer 179 may be at least 15 wt %, thereby improving the strength of the tilt layer 179.

The tilt layer 179 covers the protrusion T of the capping layer 177 and is formed to fill the empty space under the protrusion T. The tilt layer 179 may have a thickness of more than 2000 Å with respect to the upper portion of the source electrode 173, the drain electrode 175, and the upper portion of the semiconductor layer 151, except for a portion that corresponds to the side wall of the source electrode 173 and the drain electrode 175. In this case, the first passivation layer 180a made of silicon oxide ($SiO_x$) on the tilt layer 179 may be omitted. A second passivation layer 180b of the single layer made of silicon nitride ($SiN_x$) may be formed on the tilt layer 179 and may have a thickness of more than 2000 Å.

A planarization insulating layer 181 is disposed on the second passivation layer 180b. The planarization insulating layer 181, the second passivation layer 180b, and the tilt layer 179 have a contact hole 185 exposing one end of the capping layer 177. A pixel electrode 191, which may be physically and electrically connected to the capping layer 177 and the drain electrode 175 through the contact hole 185, is formed on the planarization insulating layer 181.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A thin-film transistor array panel, comprising:
   a gate line disposed on a first substrate, the gate line comprising a gate electrode;
   a semiconductor layer disposed on the first substrate, the semiconductor layer comprising an oxide semiconductor;
   a data wire layer disposed on the first substrate, the data wire layer comprising a data line crossing the gate line, a source electrode connected to the data line, and a drain electrode facing the source electrode;
   a capping layer disposed on the data wire layer;
   a tilt layer disposed on the capping layer; and
   a passivation layer disposed on the tilt layer,
   wherein the tilt layer comprises a silsesquioxane-based copolymer, and
   wherein an edge of the capping layer comprises a protrusion that protrudes outwardly beyond an edge of the data wire layer.

2. The thin-film transistor array panel of claim 1, wherein the tilt layer covers the protrusion and fills an empty space under the protrusion.

3. The thin-film transistor array panel of claim 2, wherein the capping layer comprises one of indium-zinc oxide (IZO), gallium-zinc oxide (GZO), and aluminum-zinc oxide (AZO).

4. The thin-film transistor array panel of claim 3, wherein:
   the passivation layer comprises a dual layer; and
   the dual layer comprises a first layer comprising silicon oxide ($SiO_x$) and a second layer comprising silicon nitride ($SiN_x$).

5. The thin-film transistor array panel of claim 3, wherein:
   a thickness of the capping layer is about 2000 Å or more; and
   the passivation layer comprises a single layer comprising silicon nitride ($SiN_x$).

6. The thin-film transistor array panel of claim 5, further comprising a barrier layer disposed on the semiconductor layer,
   wherein the data wire layer comprises copper or a copper alloy.

7. The thin-film transistor array panel of claim 6, wherein the barrier layer comprises one of indium-zinc oxide (IZO), gallium-zinc oxide (GZO), or aluminum-zinc oxide (AZO).

8. The thin-film transistor array panel of claim 7, wherein a content of the silsesquioxane-based copolymer in the tilt layer is at least 15 wt %.

9. The thin-film transistor array panel of claim 1, wherein a content of the silsesquioxane-based copolymer in the tilt layer is at least 15 wt %.

10. A liquid crystal display, comprising:
    a gate line disposed on a first substrate, the gate line comprising a gate electrode;
    a semiconductor layer disposed on the first substrate, the semiconductor layer comprising an oxide semiconductor;
    a data line disposed on the first substrate and crossing the gate line;
    a data wire layer comprising a source electrode connected to the data line and a drain electrode facing the source electrode;
    a capping layer disposed on the data wire layer;
    a tilt layer disposed on the capping layer;
    a passivation layer disposed on the tilt layer;
    a second substrate facing the first substrate;
    a liquid crystal layer disposed between the first substrate and the second substrate; and
    a common electrode disposed on one of the first substrate and the second substrate,
    wherein the tilt layer comprises a silsesquioxane-based copolymer, and
    wherein an edge of the capping layer comprises a protrusion that protrudes outwardly beyond an edge of the data wire layer.

11. The liquid crystal display of claim 10, wherein a content of the silsesquioxane-based copolymer in the tilt layer is at least 15 wt %.

12. A method for manufacturing a thin-film transistor array panel, the method comprising:
    forming a gate line comprising a gate electrode on a first substrate;
    forming a gate insulating layer covering the gate line;
    forming a semiconductor material layer on the first substrate;
    forming a data wire material layer on the semiconductor material layer;
    forming a capping material layer on the data wire material layer;
    forming a first photosensitive film pattern on the capping material layer, the first photosensitive film pattern comprising a first region and a second region having a greater thickness than the first region;
    etching the capping material layer, the data wire material layer, and the semiconductor material layer by using the first photosensitive film pattern as a mask;
    performing an etch back for the first photosensitive film pattern to form a second photosensitive film pattern;
    etching the capping material layer and the data wire material layer by using the second photosensitive film pattern as a mask to form a capping layer and a data wire layer;
    removing the second photosensitive film pattern; and
    forming a tilt layer on the capping layer by a solution process,
    wherein an edge of the capping layer comprises a protrusion that protrudes outwardly beyond an edge of the data wire layer.

13. The method of claim 12, wherein the tilt layer comprises a silsesquioxane-based copolymer solid and a propylene glycol monomethyl ether acetate (PGMEA) solvent.

14. The method of claim 13, wherein the capping layer comprises one of indium-zinc oxide (IZO), gallium-zinc oxide (GZO), or aluminum-zinc oxide (AZO).

15. The method of claim 14, further comprising forming a passivation layer on the capping layer and the data wire layer by a chemical vapor deposition.

16. The method of claim 15, further comprising forming a barrier material layer between the semiconductor material layer and the data wire material layer,
  wherein the barrier material layer comprises one of indium-zinc oxide (IZO), gallium-zinc oxide (GZO), or aluminum-zinc oxide (AZO).

17. The method of claim 16, wherein a content of the silsesquioxane-based copolymer solid in the tilt layer is at least 15 wt %.

* * * * *